United States Patent
Joo et al.

(10) Patent No.: US 7,079,435 B2
(45) Date of Patent: Jul. 18, 2006

(54) SENSE AMPLIFIER CIRCUIT TO WRITE DATA AT HIGH SPEED IN HIGH SPEED SEMICONDUCTOR MEMORY

(75) Inventors: Jong-doo Joo, Seongnam-si (KR); Gyu-hong Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 90 days.

(21) Appl. No.: 10/959,095

(22) Filed: Oct. 7, 2004

(65) Prior Publication Data

US 2005/0083746 A1    Apr. 21, 2005

(30) Foreign Application Priority Data

Oct. 15, 2003    (KR) .................... 10-2003-0071851

(51) Int. Cl.
*G11C 7/00*    (2006.01)

(52) U.S. Cl. ................ 365/205; 365/207; 365/189.05; 327/51

(58) Field of Classification Search ................ 365/205, 365/207, 189.05; 327/51
See application file for complete search history.

(56) References Cited

U.S. PATENT DOCUMENTS

| 5,691,950 | A | 11/1997 | McClure |
| 6,118,717 | A | 9/2000 | Brady |
| 2003/0021173 | A1* | 1/2003 | Lee et al. .................... 365/205 |

FOREIGN PATENT DOCUMENTS

| JP | 9-251780 | 11/1997 |
| KR | 10-0179099 | 11/1998 |

* cited by examiner

*Primary Examiner*—Huan Hoang
(74) *Attorney, Agent, or Firm*—Volentine Francos & Whitt

(57) ABSTRACT

A sense amplifier includes: a bit line and a complementary bit line; a data input/output line and a complementary data input/output line; first and second transistors which are connected in series between the data input/output line and the bit line; and third and fourth transistors which are connected in series between the complementary data input/output line and the complementary bit line, where the gate of the first transistor is connected to the complementary data input/output line, the gate of the third transistor is connected to the data input/output line, and a write column select line enable signal is input to the gates of the second and fourth transistors. Since the sense amplifier can write data before data of adjacent bit line pairs are amplified in a semiconductor memory device, the write timing can be reduced.

12 Claims, 10 Drawing Sheets

SENSE AMPLIFIER CIRCUIT TO WRITE DATA AT HIGH SPEED IN HIGH SPEED SEMICONDUCTOR MEMORY

CROSS REFERENCES TO RELATED APPLICATIONS

This application claims priority under 35 U.S.C. § 119 from Korean Patent Application No. 2003-71851, filed on Oct. 15, 2003, the contents of which are hereby incorporated by reference in its entirety for all purposes as if fully set forth herein.

BACKGROUND AND SUMMARY

1. Technical Field

The present invention relates to a semiconductor memory device, and more particularly, to the semiconductor memory device which includes a sense amplifier to write data at high speed.

2. Description of the Related Art

FIG. 1 is a circuit diagram of a conventional sense amplifier.

The sense amplifier 100 shown in FIG. 1 includes a bit line 101 and complementary bit line 102 pair and a data input/output line 103 and complementary data input/output line 104 pair to write data in memory cells and read the data stored in the memory cells.

The data input/output line 103 is connected to the bit line 101 via a first N-channel metal oxide semiconductor (NMOS) transistor 105 and the complementary data input/output line 104 is connected to the complementary bit line 102 via a second NMOS transistor 106. And a write column select line enable signal WCSL is input to the gate of the first NMOS transistor 105 and the gate of the second NMOS transistor 106.

Also, an equalizer 107 is connected between the bit line 101 and the complementary bit line 102. The equalizer 107 includes NMOS transistors 108 through 110. An enabled equalizer signal EQ is input to the equalizer 107 through the gates of the NMOS transistors 108 through 110 and the voltages of both the bit line 101 and the complementary bit line 102 are pre-charged to one half of a power supply voltage VCC by inputting a voltage signal VBL of the voltage VCC/2.

An amplifier 111, the bit line 101, and the complementary bit line 102 are connected through a select gate 112. The select gate 112 includes NMOS transistors 113 and 114 and the NMOS transistors 113 and 114 receive a left isolation signal ISOL via the gates of the NMOS transistors 113 and 114.

The amplifier 111 includes a plurality of transistors 105, 106, and 115 through 118 connected to the data input/output line 103 and the complementary data input/output line 104. Also, the amplifier 111 includes two NMOS transistors 119 and 120 and two P-channel metal oxide semiconductor (PMOS) transistors 121 and 122 to amplify data. The two transistors 115 and 116 are connected in series between a ground voltage VSS and the data input/output line 103 and the two transistors 117 and 118 are connected in series between the ground voltage VSS and the complementary data input/output line 104. Also, a read column select line enable signal RCSL is connected to the gates of the two transistors 116 and 118.

The gate of the NMOS transistor 119 connected to the bit line 101 is connected to the complementary bit line 102, and the gate of the NMOS transistor 120 connected to the complementary bit line 102 is connected to the bit line 101. A complementary sense amplifier enable signal SAB is input to the common contact of the two NMOS transistors 119 and 120.

The gate of the PMOS transistor 121 connected to the bit line 101 is connected to the complementary bit line 102, and the gate of the PMOS transistor 122 connected to the complementary bit line 102 is connected to the bit line 101. A sense amplifier enable signal SA is input to the common contact of the two PMOS transistors 121 and 122.

Also, another equalizer 124 and select gate 123 corresponding to the equalizer 107 and select gate 112 exist at the other end. The bit line 101 and complementary bit line 102 are connected to a plurality of memory cells (not shown), respectively. Thereby, data in the plurality of memory cells can be read and/or written using one sense amplifier.

FIG. 2 is a timing diagram for a write operation of the sense amplifier 100 shown in FIG. 1.

With reference to FIGS. 1 and 2, when the equalizer signal EQ is enabled to a high level, the transistors 108 through 110 are turned on, the voltage of the bit line 101 becomes the same as that of the complementary bit line 102, and both of the bit line 101 and the complementary bit line 102 are pre-charged to the voltage VCC/2 by inputting the VCC/2 voltage signal VBL.

Next, when the left isolation signal ISOL is enabled to the high level, the NMOS transistors 113 and 114 are turned on. Then, data can be written in and/or read from the memory cell on the left side of the sense amplifier 100. And when a right isolation signal ISOR stays at the low level, the bit line pair connected to the memory cells on the right side of the sense amplifier 100 remains in a non-selected state.

Next, when the equalizer signal EQ changes to the low level, the bit line pair 101 and 102 are in a floating state. And when a word line signal (not shown) is enabled, the voltage of the bit line 101 is changed by the data in the memory cell connected to the word line and the bit line 101. Meanwhile, the sense amplifier enable signal SA becomes the high level and the complementary sense amplifier enable signal SAB becomes the low level.

For example, if the memory cell connected to the bit line 101 has data of the low level, the voltage of the bit line 101 is a little lower than the voltage VCC/2. In that case, since the voltage of the complementary bit line 102 is higher than that of the bit line 101, the NMOS transistor 119 is turned-on, the NMOS transistor 120 is turned-off, the PMOS transistor 121 is turned-off, and the PMOS transistor 122 is turned-on. Therefore, since the voltage of the complementary bit line 102 goes to the high level (for example, the power supply voltage VCC) and the voltage of the bit line 101 goes to the ground voltage VSS, a data signal is amplified.

Then, when the write column select line enable signal WCSL is enabled to the high level, the data input/output line pair 103 and 104 and the bit line pair 101 and 102 are connected to each other. If the data input/output line 103 is at the high level and the complementary data input/output line 104 is at the low level, the on/off states of the NMOS transistors 119 and 120 and the PMOS transistors 121 and 122 in the sense amplifier 100 are changed into the opposite states, respectively. Therefore, the data level of the bit line 101 becomes equal to that of the data input/output line 103 and the data level of the complementary bit line 102 becomes equal to that of the complementary data input/output line 104. Accordingly, the data of the data input/output line 103 is written in the memory cell via the bit line 101.

The equalizer signal EQ becomes the high level after the data is written, and the bit line pair 101 and 102 is precharged.

Recently, according to a high speed dynamic random access memory (DRAM) operation, reduction in a data read/write cycle time is required for a semiconductor memory device.

However, in the conventional semiconductor memory, if the write column select line enable signal WCSL is at the high level without first amplifying data when the data is input to a selected bit line pair in a data write cycle, data of an adjacent bit line pair may be changed. That is, since, before the data is amplified the voltage of the data of a selected bit line are similar to each other, the voltage of the data may be changed by a high level voltage of an adjacent bit line.

Therefore, until the data value is restored to a voltage level sufficient to prevent the voltage level of an adjacent bit line pair from influencing a voltage level of the data value of the selected bit line, the data value of the selected bit line must be amplified by the amplifier. That is, while the amplifier amplifies the data so that the data value becomes around 500 mV, the write column select line enable signal WCSL must stay at the low level. Therefore, since the data cannot be written while the amplifier is amplifying the data, the write operation is delayed comparing to the read cycle time. Accordingly, the delay time is an obstacle to a high speed semiconductor memory device.

Also, in a data input/output (IO) structure for a high speed device in a conventional DRAM, 8 column select lines (CSLs) are connected to one data IO line pair. Also, an IO multiplexing function makes a wide IO scheme possible. If the wide IO mode is supported from the ×256 mode to the ×16 mode, data IO lines selected in only the ×128/×64/×32/×16 modes, not the ×256 mode, are active. However, at this time, since transistors connected to all CSLs are also open, current flow is induced in non-selected data IO lines. Accordingly, unnecessary power loss occurs.

Accordingly, it would be desirable to provide a semiconductor memory device including a sense amplifier circuit to write data at high speed in a memory cell of the semiconductor memory device.

It would also be desirable to provide a semiconductor memory device preventing power loss by preventing current flow of non-selected data input/output lines of data input/output lines using column select lines.

According to one aspect of the present invention a sense amplifier of a semiconductor memory device comprises a bit line and a complementary bit line; a data input/output line and a complementary data input/output line; first and second transistors which are connected in series between the data input/output line and the bit line; and third and fourth transistors which are connected in series between the complementary data input/output line and the complementary bit line, wherein a gate of the first transistor is connected to the complementary data input/output line, a gate of the third transistor is connected to the data input/output line, and a write column select line enable signal is input to the gates of the second and fourth transistors.

According to another aspect of the present invention, a sense amplifier of a semiconductor memory device comprises a bit line and a complementary bit line; a data input/output line and a complementary data input/output line; first and second transistors which are connected in series between the data input/output line and the bit line, each of the first and second transistors having a first terminal, a second terminal, and a gate; and third and fourth transistors which are connected in series between the complementary data input/output line and the complementary bit line, each of the third and fourth transistors having a first terminal, a second terminal, and a gate, wherein a write column select line enable signal is input to the gates of the first and third transistors, wherein one of the first and second terminals of the first transistor is connected to the gate and to one of the first and second terminals of the second transistor, and wherein one of the first and second terminals of the third transistor is connected to the gate and to one of the first and second terminals of the fourth transistor.

According to still another aspect of the present invention, a sense amplifier of a semiconductor memory device comprises a bit line and a complementary bit line; a data input/output line and a complementary data input/output line; first and second transistors which are connected in series between the data input/output line and the bit line; and third and fourth transistors which are connected in series between the complementary data input/output line and the complementary bit line, wherein a gate of the first transistor is connected to the data input/output line, a gate of the third transistor is connected to the complementary data input/output line, and a write column select line enable signal is input to gates of the second and fourth transistors.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 3:
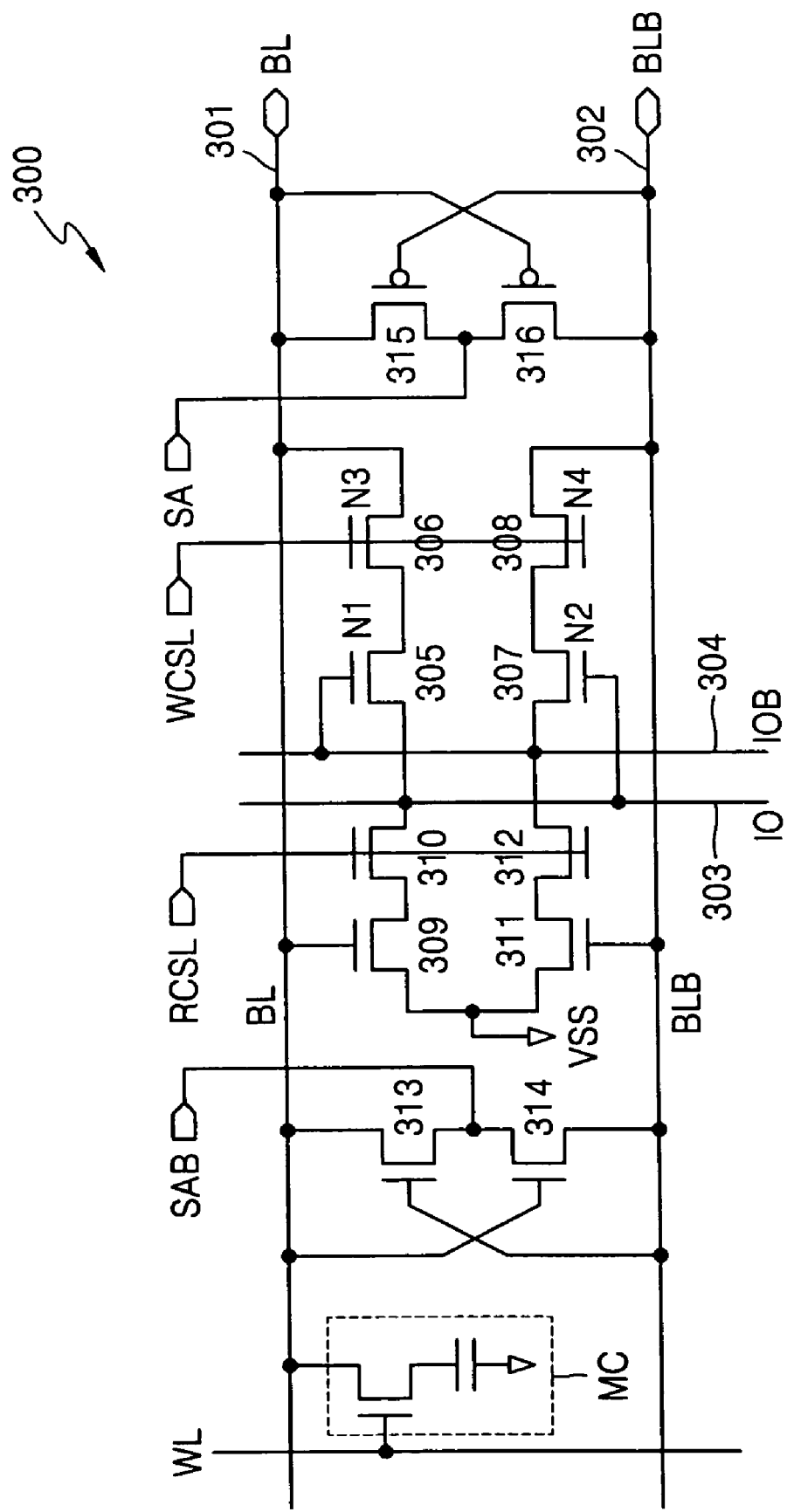
FIG. 3 is a circuit diagram of a first embodiment of a sense amplifier according to one or more aspects of the present invention.

FIG. 3 is a circuit diagram of a first embodiment of a sense amplifier according to one or more aspects of the present invention.

Figure 1:
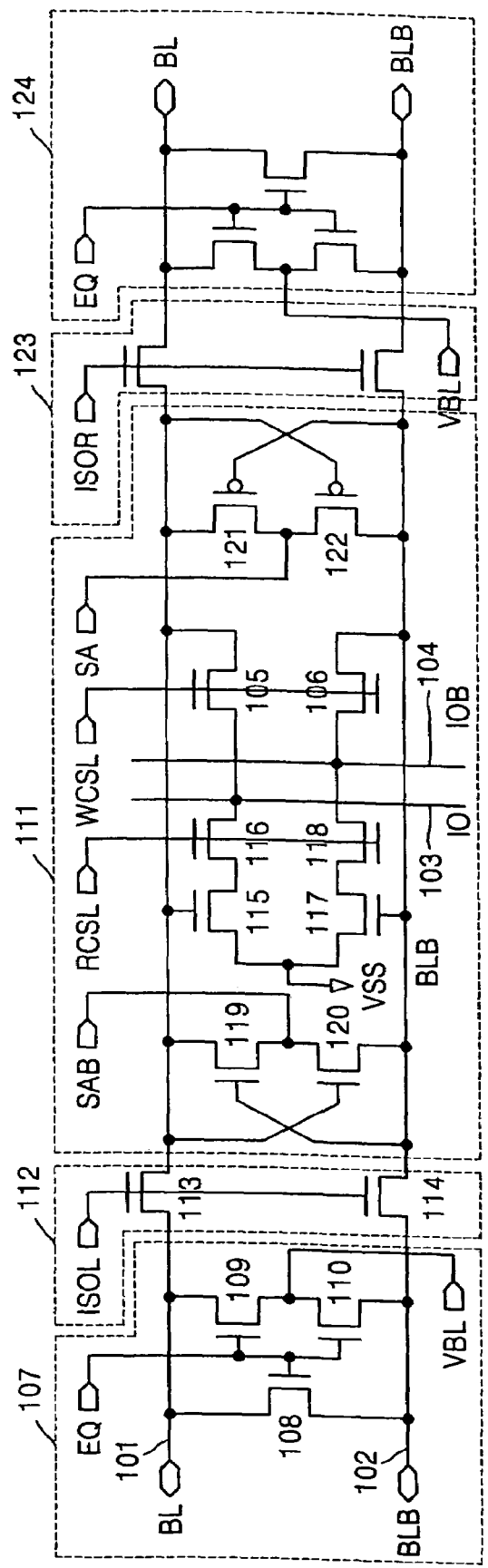
FIG. 1 is a circuit diagram of a conventional sense amplifier.

Since the equalizer and the select gate are the same as in the conventional sense amplifier of FIG. 1, they are not shown in FIG. 3.

With reference to FIG. 3, NMOS transistors 305 and 306 are connected in series between a data input/output line 303 and a bit line 301. NMOS transistors 307 and 308 are connected in series between a complementary data input/output line 304 and a complementary bit line 302. The gate of the NMOS transistor 305 is connected to the complementary data input/output line 304. The gate of the NMOS transistor 307 is connected to the data input/output line 303. Also, the write column select line enable signal WCSL is input to the gates of the NMOS transistors 306 and 308.

NMOS transistors 309 and 310 are connected in series between the data input/output line 303 and a ground voltage VSS. NMOS transistors 311 and 312 are connected in series between the complementary data input/output line 304 and the ground voltage VSS. The gate of the NMOS transistor 309 is connected to the bit line 301. The gate of the NMOS transistor 311 is connected to the complementary bit line 302. Also, a read column select line enable signal RCSL is input to the gates of the NMOS transistors 310 and 312.

Also, NMOS transistors 313 and 314 and PMOS transistors 315 and 316 to amplify data are connected between a bit line pair 301 and 302. The gate of the NMOS transistor 313 is connected to the complementary bit line 302. The gate of the NMOS transistor 314 is connected to the bit line 301. The complementary sense amplifier enable signal SAB is input to the common contact of the NMOS transistors 313 and 314. The gate of the PMOS transistor 315 is connected to the complementary bit line 302. The gate of the PMOS transistor 316 is connected to the bit line 301. The sense amplifier enable signal SA is input to the common contact of the PMOS transistors 315 and 316.

The bit line 301 and complementary bit line 302 of the sense amplifier 300 shown in FIG. 3 can be pre-charged to a power supply voltage VCC or the ground voltage VSS.

A case where a low level data is input to the data input/output line 303 in the sense amplifier 300 of FIG. 3 is now described. The NMOS transistor 307 is turned off in response to the low level data value of the data input/output line 303, and the NMOS transistor 305 is turned on in response to a high level data value of the complementary data input/output line 304. Therefore, when the write column select line enable signal WCSL is at the high level, the low level voltage of the data input/output line 303 is driven to the bit line 301. Since the NMOS transistor 307 is turned-off, the complementary bit line 302 is in the floating state, that is, has a data value stored in a memory cell.

Next, a case where the high level data is input to the data input/output line 303 in the sense amplifier 300 of FIG. 3 is described. The NMOS transistor 307 is turned on in response to the high level data value of the data input/output line 303 and the NMOS transistor 305 turned off in response to the low level data value of the complementary data input/output line 304. Therefore, when the write column select line enable signal WCSL is at the high level, the low level voltage of the complementary data input/output line 304 is driven to the complementary bit line 302. Since the NMOS transistor 305 is at turned-off, the bit line 301 is in the floating state, that is, has a data value stored in the memory cell.

According to the sense amplifier 300 shown in FIG. 3, the voltage value with the low level data value of the data values of the data input/output line pair 303 and 304 in the write operation is driven to the bit line pair 301 and 302. That is, since only the data with the low level data value is driven and the data with the high level data value is cut off, the bit line pair connected to the data input/output line pair with the high level data value is in the floating state. Therefore, the sense amplifier 300 does not allow the high level voltage to influence a voltage level of an adjacent bit line pair and does not hurt the data value of the adjacent bit line pair.

Accordingly, a step where the data value of the bit line pair in the write operation must be restored to a sufficient voltage level not to be influenced from voltage driving the adjacent bit line, is not necessary. Therefore, before the sense amplifier is operated and the data of the bit line pair is amplified, the data can be driven by enabling the write column select line enable signal WCSL. Accordingly, the write timing can be reduced similar to the read timing.

Figure 4:
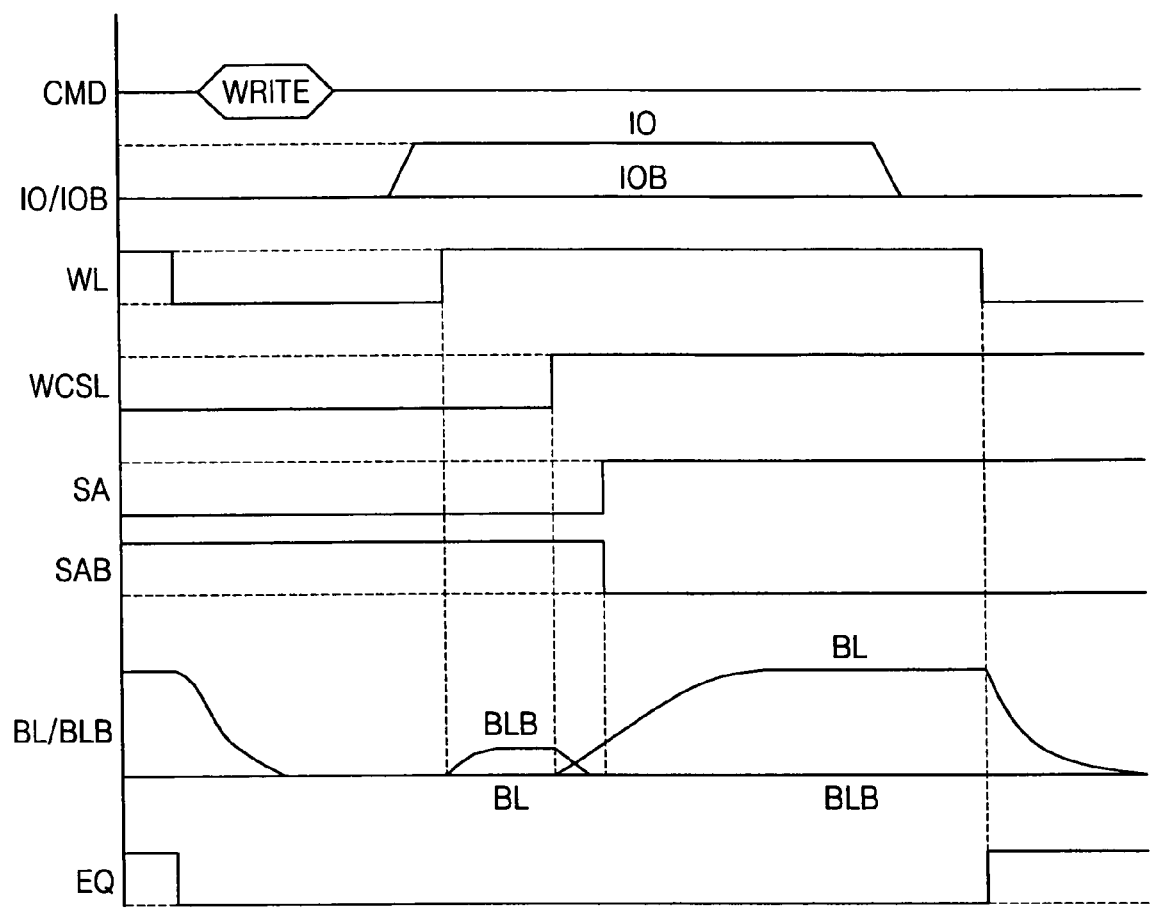
FIG. 4 is a timing graph of the sense amplifier shown in FIG. 3.

FIG. 4 is a timing diagram for a write operation of the sense amplifier shown in FIG. 3.

Figure 2:
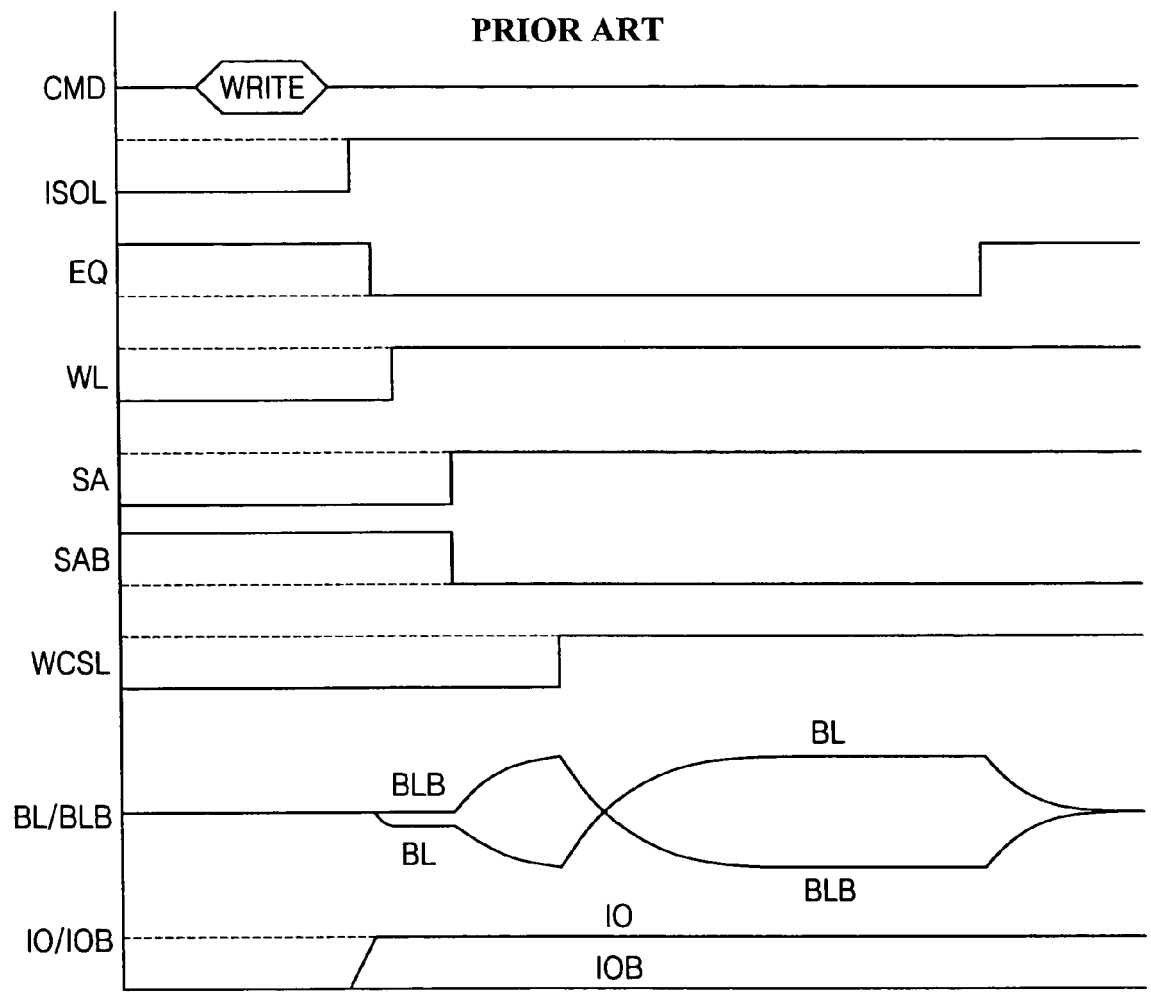
FIG. 2 is a timing graph in a write operation of the sense amplifier shown in FIG. 1.

With reference to FIGS. 2 through 4, the equalizer operation and memory cell select operation before the data write operation in FIG. 4 are the same as those described with respect to FIG. 2. That is, if the left isolation signal ISOL transitions from the low level state to the high level state, the memory cell connected to the left side of the sense amplifier is connected to the bit line pair. Next, when the equalizer signal EQ is at the high level, the bit line pair 301 and 302 are pre-charged to the same voltage level as VCC or VSS. When the equalizer signal EQ is at the low level, the bit line pair 301 and 302 are in the floating state. And if the word line signal is enabled, the voltage of the bit line 301 is changed by the memory cell data connected to the word line and the bit line.

Now a case where high level data is input to the data input/output line 303, and low level data is input to the complementary data input/output line 304, is described.

By the word line enable signal (not shown), the voltages of the bit line pair 301 and 302 are changed under the influence of the memory cell data connected to the word line and the bit line pair. A case where the voltage of the complementary bit line 302 is a little higher than ground voltage, since the memory cell connected to the complementary bit line 302 has high level data, is shown in FIG. 4.

And in the conventional sense amplifier, the sense amplifier enable signal SA is active prior to the write column select line enable signal WCSL. However, in the sense amplifier of FIG. 3, the write column select line enable signal WCSL can be active at the same time as, or prior to, the sense amplifier enable signal SA.

When the write column select line enable signal WCSL is the high level, the NMOS transistors 306 and 308 is on and the data input/output line pair 303 and 304 is connected to the bit line pair 301 and 302. However, by the NMOS transistors 305 and 307, only the line with the low data of the data input/output line pair is connected to the bit line pair.

In a case where the data input/output line 303 has high level data and the complementary data input/output line 304 has low level data, since the NMOS transistor 305 is off, the bit line 301 is in the floating state, and since the NMOS transistor 307 is on, the complementary bit line 302 is driven to the low level voltage.

Next, when the sense amplifier enable signal SA transitions to the high level, and the complementary sense amplifier enable signal SAB transitions to the low level, the data of the bit line pair 301 and 302 is amplified by the relative difference. That is, since the voltage of the bit line 301 is higher than that of the complementary bit line 302, the NMOS transistor 313 is off, the NMOS transistor 314 is on, the ground voltage of the complementary sense amplifier enable signal SAB is driven to the complementary bit line 302, and the complementary bit line 302 transitions to the low level. Also, since the PMOS transistor 315 is on and the PMOS transistor 316 is off, the power supply voltage VCC of the sense amplifier enable signal SA is driven to the bit line 301, and the bit line 301 transitions to the high level.

And when the equalizer signal EQ transitions to the high level again, the bit line pair is pre-charged to the ground voltage.

In the timing diagram of FIG. 4, only the case where the sense amplifier according to an embodiment of the present invention is pre-charged to the ground voltage is described, however, a case where the bit line pair is pre-charged to VCC may also bring the same operation and effect.

Figure 5A:
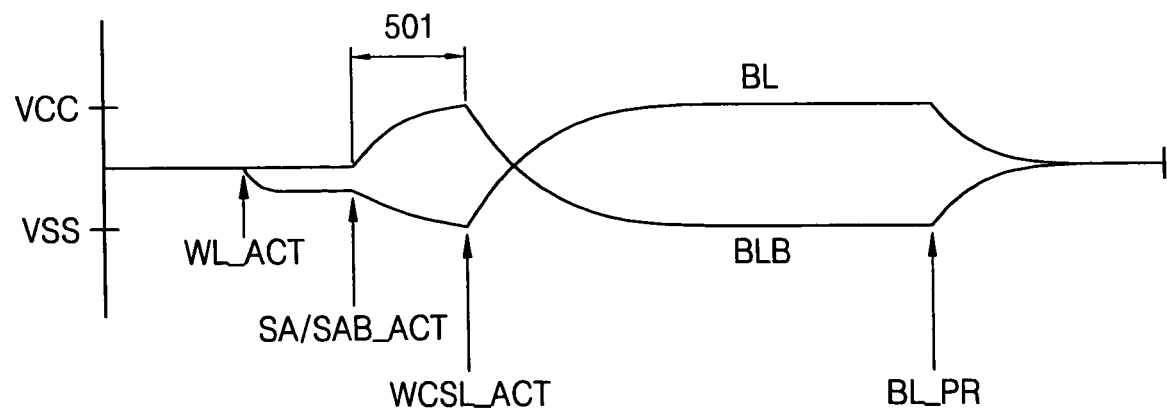
FIGS. 5a and 5b are graphs comparing timing in the write operation of the conventional sense amplifier to that of the sense amplifier of FIG. 3.
Figure 5B:
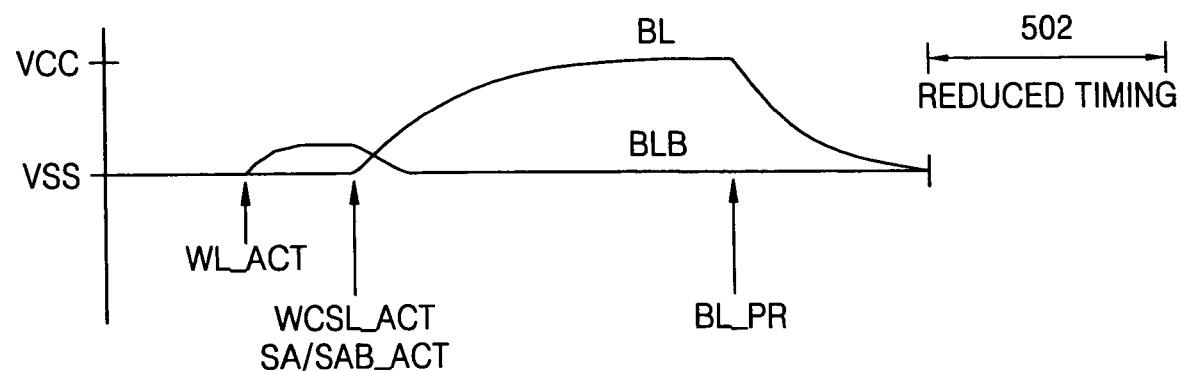

FIGS. 5a and 5b are graphs comparing timing in the write operation of the conventional sense amplifier to that of the sense amplifier of FIG. 3.

FIG. 5a is a timing graph of a write operation of the conventional sense amplifier. With reference to FIG. 5a, when the bit line pair 101 and 102 is pre-charged to VCC/2, the word line enable signal is active. After the sense amplifier is active and the bit line pair 101 and 102 is amplified to a sufficient voltage level, data is written by enabling the column select line. Finally, the bit line pair 101 and 102 is pre-charged to VCC/2 again.

FIG. 5b is a timing graph of the write operation of the sense amplifier of FIG. 3. With reference to FIG. 5b, when the bit line pair 301 and 302 is pre-charged to VSS, the word line enable signal is active. And data is written by enabling the column select line at the same time as, or prior to, the sense amplification. Finally, the bit line pair 301 and 302 is pre-charged to VSS again.

Comparing FIG. 5a to FIG. 5b, since the sense amplifier of FIG. 3 does not influence a data value of an adjacent bit line pair, because only the low level data is driven to the bit line pair 301 and 302, the sense amplifier of FIG. 3 does not need the time 501 from enabling the sense amplifier to enabling the column select line. Therefore, the time 501 can be reduced. That is, in the write cycle, the cycle of FIG. 5b is reduced as the reduced time 502, compared to the write cycle of FIG. 5a.

In current semiconductor devices, a wide input/output line structure for high speed operation is used and 8 column select lines are connected to each input/output line. A structure having a bit line pair connected to a column select line pair is shown in FIG. 6.

Figure 6:
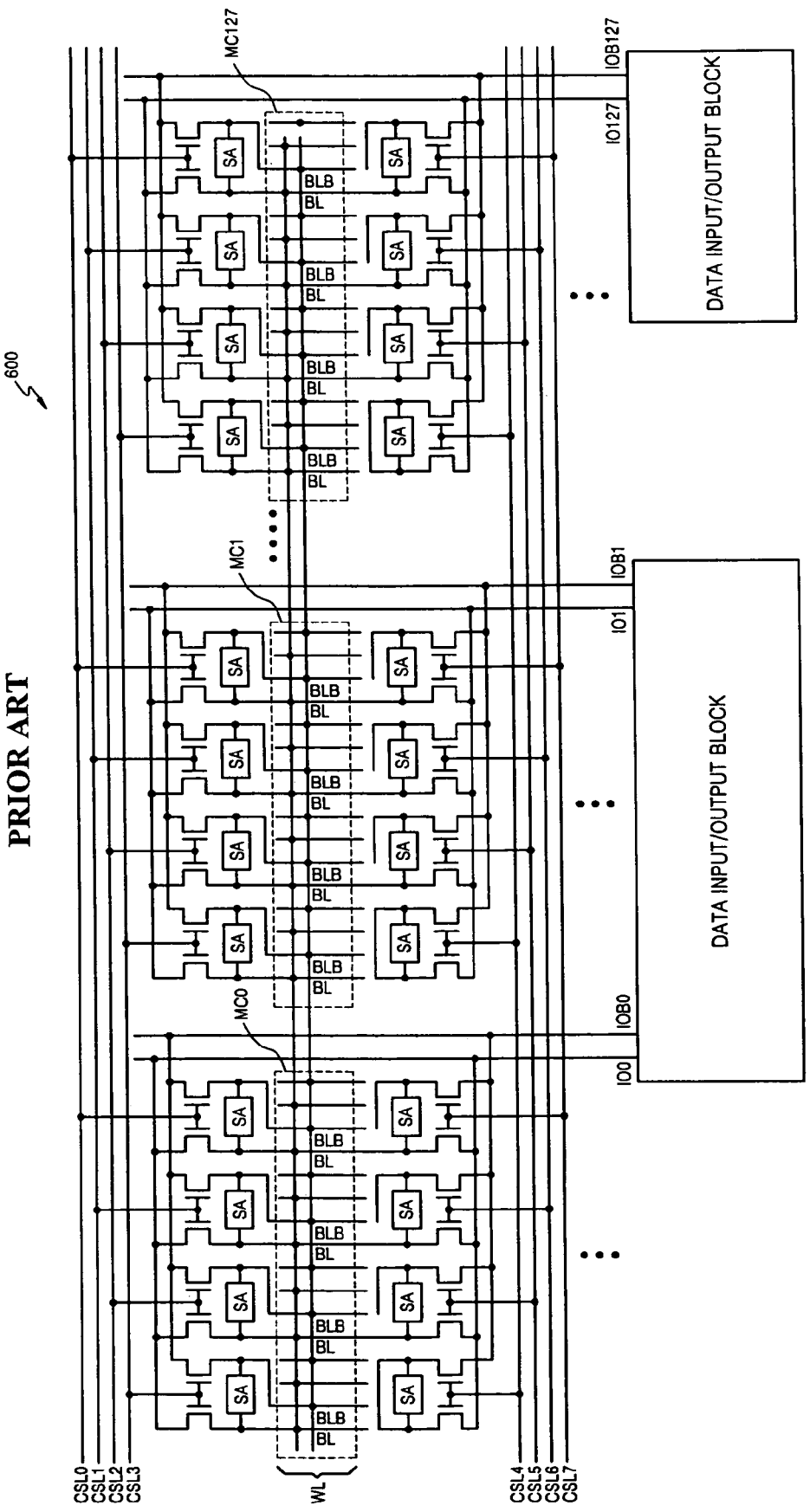
FIG. 6 is a circuit diagram of a data input/output circuit of a conventional embedded DRAM.

FIG. 6 is a circuit diagram of a data input/output circuit 600 of a conventional embedded DRAM. Sub memory cell blocks MC0 through MC127 sharing the word line WL are arranged at predetermined intervals. Also, the bit line sense amplifiers SA and the data input/output lines IO0 and IOB0 through IO127 and IOB127 are arranged close to the sub memory cell blocks MC0 through MC127. Data input/output blocks are connected to the data input/output line pairs IO0 and IOB0 through IO127 and IOB127.

With reference to FIG. 6, each sense amplifier SA is connected to the data input/output line pair and the sense amplifiers SA and the data input/output line pairs are controlled by the column select lines CSL0 through CSL7. The wide IO scheme is facilitated by the IO multiplexing function. If the wide IO mode is supported from the ×256 mode to the ×16 mode, the data input/output lines only selected in the ×128/×64/×32/×16 modes not the ×256 mode are active. However, at this time, since transistors connected to all column select lines are also open, current flow is induced in the non-selected data input/output lines. Accordingly, unnecessary power loss occurs.

However, with the sense amplifier shown in FIG. 3, the NMOS transistors 305 and 307 are controlled by the data input/output line pair and prevent current flow to the non-selected data input/output line pairs. That is, if there are not the NMOS transistors 305 and 307, when the NMOS transistors 306 and 308 connected to the column select line are turned on, the bit line pair and the data input/output line pair are turned on and the current flows. Since the current flows even though the data input/output lines are not selected, unnecessary power loss still occurs. In the present sense amplifier, since the NMOS transistors 305 and 307 prevent voltage driving to the bit line pair even though the high level voltage is impressed to the data input/output lines, power loss is reduced.

Figure 7:
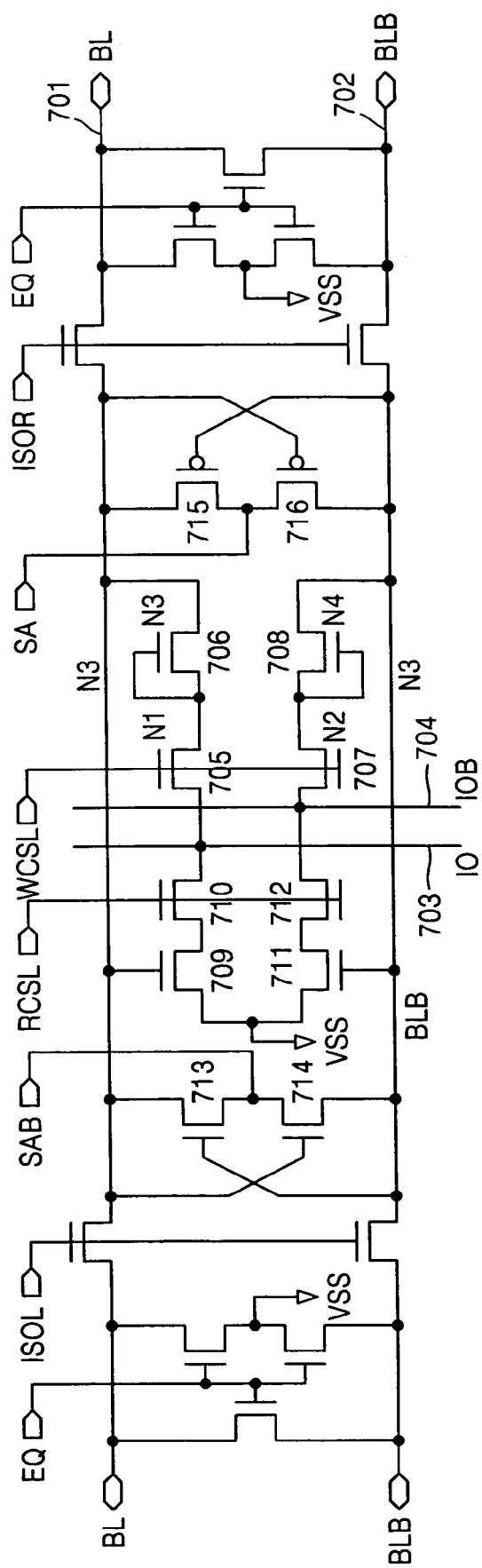
FIG. 7 is a circuit diagram of a second embodiment of a sense amplifier according to one or more aspects of the present invention.

FIG. 7 is a circuit diagram of a second embodiment of a sense amplifier according to one or more aspects of the present invention.

The sense amplifier of a semiconductor memory device shown in FIG. 7 has the same equalizer and select gate as those of the sense amplifiers shown in FIGS. 1 and 3.

With reference to FIG. 7, NMOS transistors 705 and 706, each having first and second terminals (sources and drains), are connected in series between a data input/output line 703 and a bit line 701. Also, NMOS transistors 707 and 708, each having first and second terminals (sources and drains), are connected in series between a complementary data input/output line 704 and a complementary bit line 702. The write column select line enable signal WCSL is input to the gates of the NMOS transistors 705 and 707. The gate of the NMOS transistor 706 is connected to a terminal (e.g., the source) of the NMOS transistor 705 and to a terminal (e.g., the drain) of the NMOS transistor 706. The gate of the NMOS transistor 708 is connected to a terminal (e.g., the source) of the NMOS transistor 707 and to a terminal (e.g., the drain) of the NMOS transistor 708.

NMOS transistors 709 and 710 are connected in series between the data input/output line 703 and the ground voltage VSS. NMOS transistors 711 and 712 are connected in series between the complementary data input/output line 704 and the ground voltage VSS. The gate of the NMOS transistor 709 is connected to the bit line 701. The gate of the NMOS transistor 711 is connected to the complementary bit line 702. Also, the read column select line enable signal RCSL is input to the gates of the NMOS transistors 710 and 712.

Also, NMOS transistors 713 and 714 and PMOS transistors 715 and 716 to amplify data are connected between the bit line pair 701 and 702. The gate of the NMOS transistor 713 is connected to the complementary bit line 702. The gate of the NMOS transistor 714 is connected to the bit line 701. The complementary sense amplifier enable signal SAB is input to the common contact of the NMOS transistors 713 and 714. The gate of the PMOS transistor 715 is connected to the complementary bit line 702. The gate of the PMOS transistor 716 is connected to the bit line 701. The sense amplifier enable signal SA is input to the common contact of the PMOS transistors 715 and 716.

The bit line pair 701 and 702 of the sense amplifier shown in FIG. 7 can be pre-charged to the power supply voltage VCC or the ground voltage VSS. Until the equalizer signal EQ transitions to the low level, the bit line pair 701 and 702 keeps the ground voltage level.

Now, a case where low level data is input to the data input/output line 703 in the sense amplifier of FIG. 7 is described. When the write column select line enable signal WCSL is at the high level, the NMOS transistors 705 and 707 are turned on. Therefore, the low level data value of the data input/output line 703 is driven to the NMOS transistor 706 and the high level data value of the complementary data input/output line 704 is driven to the NMOS transistor 708. At this time, since the drains and gates of the NMOS transistors 706 and 708 are connected, respectively, the NMOS transistors 706 and 708 are operated as NMOS diodes. Therefore, the NMOS transistor 706 is turned off and the bit line 701 is in the floating state, while the NMOS transistor 708 is turned on and the high level data is driven to the complementary bit line 702. However, the power supply voltage VCC input at first to the complementary data input/output line 704 drops as low as VCC−2Vt after passing through the NMOS transistor 707 and the NMOS diode 708.

For example, if VCC is 1.2V and Vt is 0.4V, VCC−2Vt becomes about 0.4V and is driven to the bit line pair 701 and 702 considering the body effect.

Usually, the voltage difference of the bit line pair is around 0.1V in charge sharing of DRAM. Therefore, even in a case where the low data are already stored in the memory cells, if at least 0.2V is transferred from the data input/output line to the bit line, data can be written in the memory cell without hurting the data.

Therefore, in the write operation of the semiconductor memory in the sense amplifier circuit shown in FIG. 7, since a voltage value is transferred to the bit line after falling as low as VCC−2Vt, there is not a coupling with an adjacent bit line pair. Therefore, the sense amplifier does not damage the data of the adjacent bit line pair in the write operation.

When the sense amplifier signal pair SA and SAB is active, the data of the bit line pair is amplified to VCC and the ground voltage, again. Finally, the voltage stored in the memory cell is VCC.

Therefore, since the sense amplifier of FIG. 7 does not have to amplify data of an adjacent bit line, the write timing can be reduced as much as the time preceding the turn-on of the column select line comparing to the data write cycle in the conventional sense amplifier.

When high level data is input to the data input/output line 703 in the sense amplifier of FIG. 7, the operation is opposite to the case where the low level data is input to the data input/output line 703. Since the voltage transferred to the bit line drops as low as VCC−2Vt, the sense amplifier does not damage the data of the adjacent bit line pair.

Figure 8:
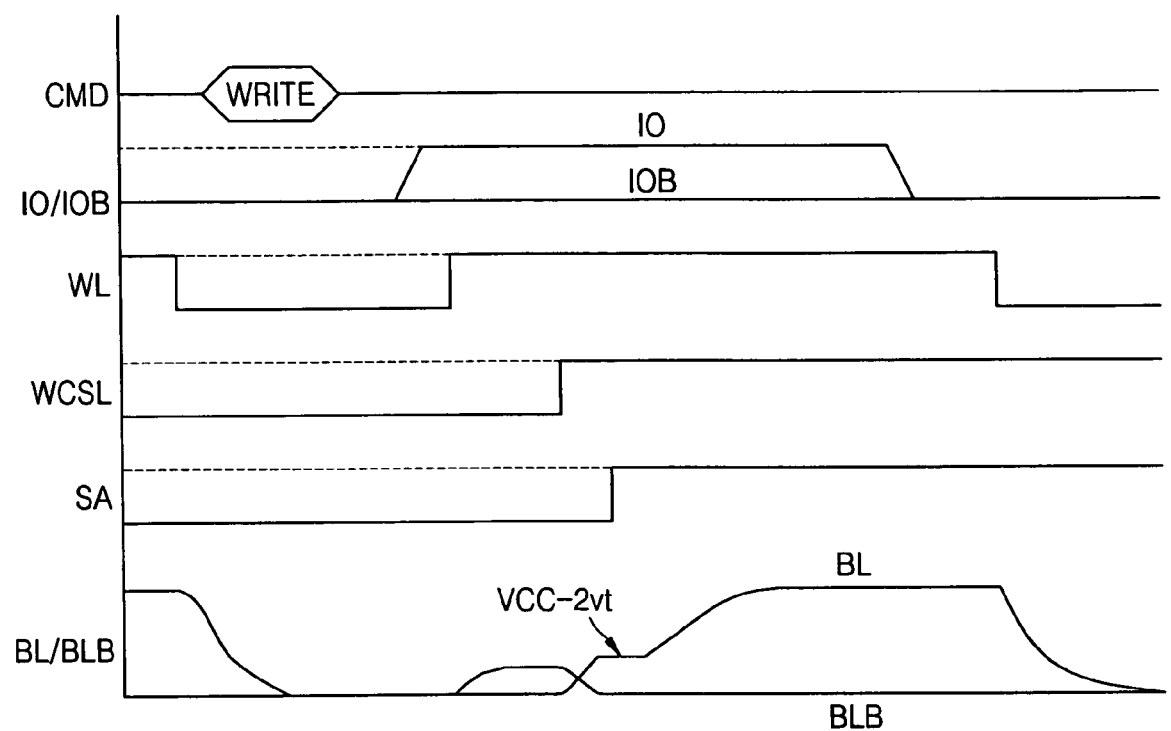
FIG. 8 is a timing graph in a write operation of the sense amplifier shown in FIG. 7.

FIG. 8 is a timing diagram of the write operation of the sense amplifier shown in FIG. 7. The equalizer operation and the memory cell select operation prior to the write operation are the same as the description of FIG. 2.

With reference to FIG. 8, when the word line WL signal is enabled, the voltage of the bit line is changed by the influence of the memory cell data connected to the word line and bit line. If low level data has been written in the memory cell, the voltage of the bit line 701 is at the ground voltage and the voltage of the complementary bit line 702 becomes about 0.1V.

Now, a case where the high level data is input to the data input/output line 703 and the low level data is input to the complementary data input/output line 704 is described. When the write column select line signal WCSL transitions to the high level, the data value of the data input/output line 703 is transferred to the bit line 701. However, the lowered or reduced voltage value, as low as VCC−2Vt is transferred to the bit line 701 by the influence of the threshold voltage of the two NMOS transistors 705 and 706 or 707 and 708. Therefore, the voltage of the bit line 701 at the ground voltage level by the charge sharing increases to VCC−2Vt by the voltage of the data input/output line 703. And the voltage of the bit line 701 is amplified from VCC−2Vt to VCC by the sense amplifier. Finally, the data '1' is written in the memory cell.

Figure 9:
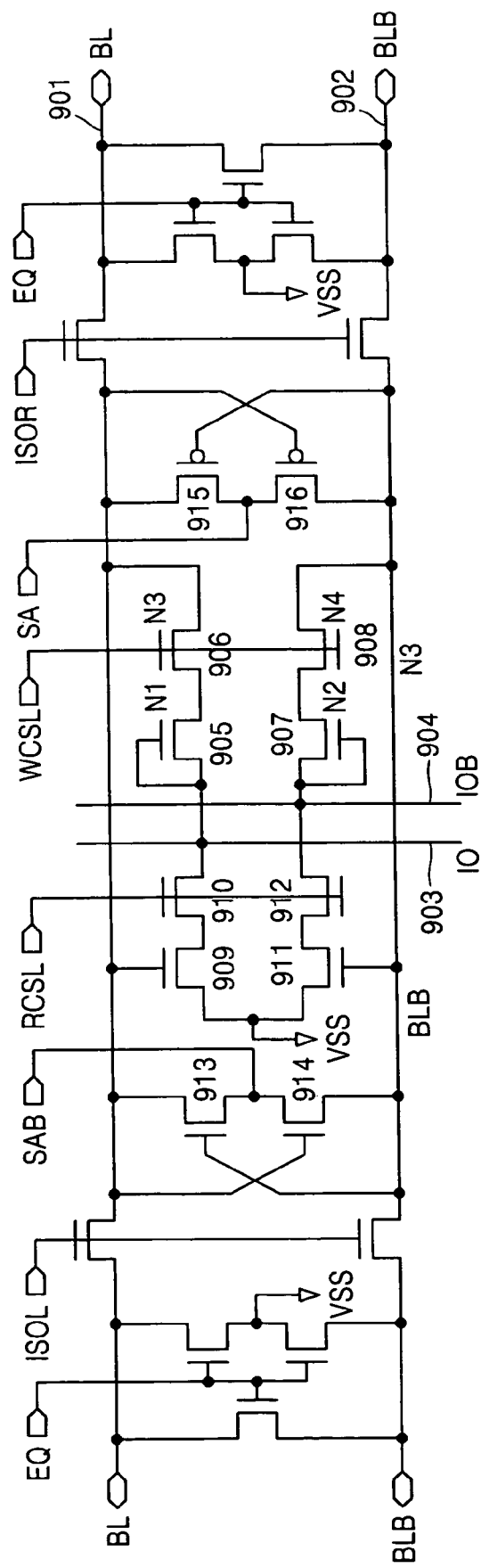
FIG. 9 is a circuit diagram of a third embodiment of a sense amplifier according to one or more aspects of the present invention.

FIG. 9 is a circuit diagram of a third embodiment of a sense amplifier according to one or more aspects of the present invention.

The sense amplifier of a semiconductor memory device sown in FIG. 9 has the same equalizer and select gate as those of the sense amplifier shown in FIG. 1.

With reference to FIG. 9, NMOS transistors 905 and 906 are connected in series between a data input/output line 903 and a bit line 901. NMOS transistors 907 and 908 are connected in series between a complementary data IO line 904 and a complementary bit line 902. The write column select line enable signal WCSL is input to the gates of the NMOS transistors 906 and 908. The gate of the NMOS transistor 905 is connected to the data input/output line 903. The gate of the NMOS transistor 907 is connected to the complementary data input/output line 904.

NMOS transistors 909 and 910 are connected in series between the data input/output line 903 and the ground voltage VSS. NMOS transistors 911 and 912 are connected in series between the complementary data input/output line 904 and the ground voltage VSS. The gate of the NMOS transistor 909 is connected to the bit line 901. The gate of the NMOS transistor 911 is connected to the complementary bit line 902. The read column select line enable signal RCSL is input to the gates of the NMOS transistors 910 and 912.

Also, NMOS transistors 913 and 914 and PMOS transistors 915 and 916 to amplify data are connected between the bit line pair 901 and 902 to amplify data. The gate of the NMOS transistor 913 is connected to the complementary bit line 902. The gate of the NMOS transistor 914 is connected to the bit line 901. The complementary sense amplifier enable signal SAB is input to the common contact of the NMOS transistors 913 and 914. The gate of the PMOS transistor 915 is connected to the complementary bit line 902. The gate of the PMOS transistor 916 is connected to the bit line 901. The sense amplifier enable signal SA is input to the common contact of the PMOS transistors 915 and 916.

The sense amplifier of FIG. 9 operates in the same way as that of FIG. 7. The only difference is that the high level data value of the data input/output line pair is transferred to the bit line pair after the value becomes drops to VCC−Vt by the influence of the NMOS transistors. Since the voltage VCC impressed to the gates of the NMOS transistors 906 and 908 is higher than the voltage VCC−Vt impressed to the drains of the NMOS transistors 906 and 908, the voltage VCC−Vt impressed to the drains of the NMOS transistors 906 and 908 does not decrease due to the NMOS transistors 906 and 908 and is transferred to the bit line pair 901 and 902.

Now, a case where high level data is input to the data input/output line 903 in the write operation in the sense amplifier of FIG. 9 is described. In the sense amplifier of FIG. 9, when high level data is input to the data input/output line 903, the NMOS transistor 905 is turned on and the NMOS transistor 907 is turned off. Therefore, when the write column select line enable signal WCSL is at the high level, only the high level voltage of the data input/output line 903 is transferred to the bit line 901, the low level data value of the complementary data input/output line 904 is not transferred, and the complementary bit line 902 is in the floating state.

However, the voltage input to the data input/output line 903 at first decreases from the power supply voltage VCC to VCC−Vt after passing through the NMOS transistor 905.

Therefore, when data is written using the sense amplifier of FIG. 9, since the low voltage of VCC−Vt is transferred to the bit line, the data can be written without damaging data values of adjacent bit lines. The sense amplifier shown in FIG. 9 does not need a step which enables the column select line after the bit line is amplified to a predetermined level in order to protect the data values of the adjacent bit lines, such as the conventional sense amplifier did.

Therefore, since the column select line signal WCSL can be enabled early, the write timing can be reduced.

Figure 10A:
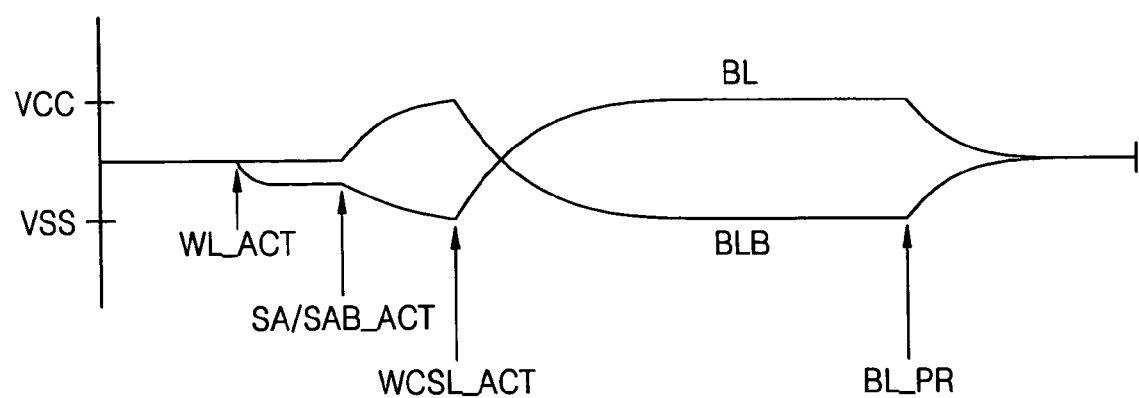
FIGS. 10a and 10b are graphs comparing timing in the write operation of the conventional sense amplifier to those of the sense amplifiers shown in FIGS. 7 and 9, respectively.
Figure 10B:
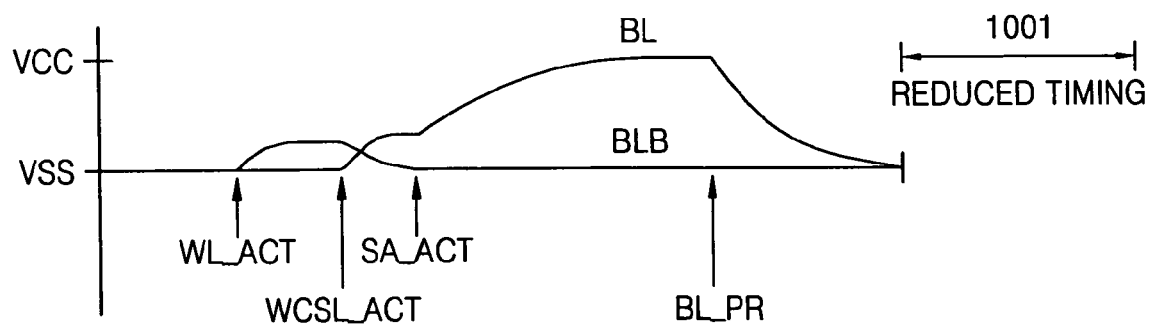

FIGS. 10A and 10B are graphs comparing timing in the write operation of the conventional sense amplifier to those of the sense amplifiers shown in FIGS. 7 and 9, respectively.

FIG. 10A is a timing graph in the write operation in the conventional sense amplifier. With reference to FIG. 1A, the word line is active when the bit line pair is at the pre-charged voltage VCC/2. Next, data is written by enabling the column select line after the sense amplifier is active and the bit line pair is amplified to a sufficient voltage level.

With reference to FIG. 10B, the word line is active when the bit line pair is at the pre-charged voltage VSS. Next, after the column select line is active and data is written, the sense amplifier is active. And the bit line pair is pre-charged to VSS.

Comparing FIG. 10A to FIG. 10B, since the sense amplifier according to FIGS. 7 and 9 transfers the low voltage to the bit line pair, the sense amplifier does not damage data values of adjacent bit line pairs. Therefore, the sense amplifier does not have to enable the column select line after the bit line is amplified to a sufficient level. Therefore, since data can be transferred before the data is amplified by the sense amplifier in the write operation, the operation time can be reduced. That is, the timing in the write operation is reduced such as the time 1001 of FIG. 10B.

According to the semiconductor memory device of the present invention, since data can be written at high speed in a memory cell of the semiconductor memory device, a write timing can be reduced as much as a read timing.

Also, according to the semiconductor memory device of the present invention, since the current of the non-selected input/output lines of the input/output lines using the column select lines are prevented from flowing, power loss can be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A sense amplifier of a semiconductor memory device, comprising:
   a bit line and a complementary bit line;
   a data input/output line and a complementary data input/output line;
   first and second transistors which are connected in series between the data input/output line and the bit line; and
   third and fourth transistors which are connected in series between the complementary data input/output line and the complementary bit line,
   wherein a gate of the first transistor is connected to the complementary data input/output line, a gate of the third transistor is connected to the data input/output line, and a write column select line enable signal is input to the gates of the second and fourth transistors.

2. The sense amplifier of claim 1, wherein the first through fourth transistors are NMOS transistors.

3. The sense amplifier of claim 2, further comprising:
   fifth and sixth NMOS transistors which are connected in series between the data input/output line and a ground voltage; and
   seventh and eighth NMOS transistors which are connected in series between the complementary data input/output line and the ground voltage,
   wherein a gate of the fifth transistor is connected to the bit line, a gate of the seventh transistor is connected to the complementary bit line, and the read column select line enable signal is input to gates of the sixth and eighth transistors.

4. The sense amplifier of claim 3, further comprising:
   ninth and tenth NMOS transistors which are connected in series between the bit line and the complementary bit line; and
   eleventh and twelfth NMOS transistors which are connected in series between the bit line and the complementary bit line,
   wherein a gate of the ninth transistor is connected to the complementary bit line, a gate of the tenth transistor is connected to the bit line, a gate of the eleventh transistor is connected to the complementary bit line, a gate of the twelfth transistor is connected to the bit line, a complementary sense amplifier enable signal is connected to a common node of the ninth and tenth NMOS transistors, and a sense amplifier enable signal is connected to a common node of the eleventh and twelfth NMOS transistors.

5. A sense amplifier of a semiconductor memory device, comprising:
   a bit line and a complementary bit line;
   a data input/output line and a complementary data input/output line;
   first and second transistors which are connected in series between the data input/output line and the bit line, each of the first and second transistors having a first terminal, a second terminal, and a gate; and
   third and fourth transistors which are connected in series between the complementary data input/output line and the complementary bit line, each of the third and fourth transistors having a first terminal, a second terminal, and a gate,
   wherein a write column select line enable signal is input to the gates of the first and third transistors,
   wherein one of the first and second terminals of the first transistor is connected to the gate and to one of the first and second terminals of the second transistor, and
   wherein one of the first and second terminals of the third transistor is connected to the gate and to one of the first and second terminals of the fourth transistor.

6. The sense amplifier of claim 5, wherein the first through fourth transistors are NMOS transistors.

7. The sense amplifier of claim 5, further comprising:
   fifth and sixth NMOS transistors which are connected in series between the data input/output line and a ground voltage; and
   seventh and eighth NMOS transistors which are connected in series between the complementary data input/output line and the ground voltage,
   wherein a gate of the fifth transistor is connected to the bit line, a gate of the seventh transistor is connected to the complementary bit line, and the read column select line enable signal is input to gates of the sixth and eighth transistors.

8. The sense amplifier of claim 7, further comprising:
   ninth and tenth NMOS transistors which are connected in series between the bit line and the complementary bit line; and eleventh and twelfth NMOS transistors which are connected in series between the bit line and the complementary bit line, wherein a gate of the ninth transistor is connected to the complementary bit line, a gate of the tenth transistor is connected to the bit line, a gate of the eleventh transistor is connected to the complementary bit line, a gate of the twelfth transistor is connected to the bit line, a complementary sense amplifier enable signal is connected to a common node of the ninth and tenth NMOS transistors, and a sense amplifier enable signal is connected to a common node of the eleventh and twelfth NMOS transistors.

9. A sense amplifier of a semiconductor memory device, comprising:

a bit line and a complementary bit line;

a data input/output line and a complementary data input/output line;

first and second transistors which are connected in series between the data input/output line and the bit line; and third and fourth transistors which are connected in series between the complementary data input/output line and the complementary bit line, wherein a gate of the first transistor is connected to the data input/output line, a gate of the third transistor is connected to the complementary data input/output line, and a write column select line enable signal is input to gates of the second and fourth transistors.

10. The sense amplifier of claim 9, wherein the first through fourth transistors are NMOS transistors.

11. The sense amplifier of claim 9, further comprising:

fifth and sixth NMOS transistors which are connected in series between the data input/output line and a ground voltage; and seventh and eighth NMOS transistors which are connected in series between the complementary data input/output line and the ground voltage, wherein a gate of the fifth transistor is connected to the bit line, a gate of the seventh transistor is connected to the complementary bit line, and the read column select line enable signal is input to the gates of the sixth and eighth transistors.

12. The sense amplifier of claim 11, further comprising:

ninth and tenth NMOS transistors which are connected in series between the bit line and the complementary bit line; and eleventh and twelfth NMOS transistors which are connected in series between the bit line and the complementary bit line, where a gate of the ninth transistor is connected to the complementary bit line, a gate of the tenth transistor is connected to the bit line, a gate of the eleventh transistor is connected to the complementary bit line, a gate of the twelfth transistor is connected to the bit line, a complementary sense amplifier enable signal is connected to a common node of the ninth and tenth NMOS transistors, and a sense amplifier enable signal is connected to a common node of the eleventh and twelfth NMOS transistors.

* * * * *